US006118323A

United States Patent [19]
Chaine et al.

[11] Patent Number: 6,118,323
[45] Date of Patent: Sep. 12, 2000

[54] ELECTROSTATIC DISCHARGE PROTECTION CIRCUIT AND METHOD

[75] Inventors: Michael D. Chaine, Missouri City; Thuyanh Bui; Scott E. Smith, both of Sugar Land, all of Tex.

[73] Assignee: Texas Instruments Incorporated, Dallas, Tex.

[21] Appl. No.: 08/996,734

[22] Filed: Dec. 23, 1997

Related U.S. Application Data

[60] Provisional application No. 60/034,675, Jan. 10, 1997.

[51] Int. Cl.[7] ................................................. G11C 7/00
[52] U.S. Cl. ................................... 327/333; 327/108
[58] Field of Search .................................. 327/108, 112, 327/333, 199; 326/56, 62, 63, 80–83, 85–87, 91; 365/189.11, 189.05, 205

[56] References Cited

U.S. PATENT DOCUMENTS

| | | | |
|---|---|---|---|
| 5,389,834 | 2/1995 | Kinugasa et al. | 326/21 |
| 5,798,972 | 8/1998 | Lao et al. | 365/189.11 |
| 5,821,136 | 10/1998 | Chan et al. | 438/158 |
| 5,831,450 | 11/1998 | Velayudhan et al. | 326/83 |

*Primary Examiner*—My-Trang Nuton
*Attorney, Agent, or Firm*—Robert N. Rountree; Michael K. Skrehot; Richard L. Donaldson

[57] ABSTRACT

An integrated circuit includes a voltage supply internal to the integrated circuit and circuitry for sensing the voltage level of the internal voltage supply, the circuitry responsive to produce a flag signal, VPUEN, that is in a first logical state when the voltage level is below the desired level and in a second logical state when the voltage level is above the desired level. The integrated circuit also includes a buffer driver 406 having an input terminal and an output terminal, the input terminal being coupled to the circuitry for sensing the voltage level of the internal voltage supply. The operation of the circuit is such that the output terminal 400 of the buffer driver is in a high-impedance state when the flag signal is in the first logical state, and is responsive to data signals on the input terminal to produce corresponding output signals at the output terminal when the flag signal is in the second logical state.

16 Claims, 5 Drawing Sheets

ELECTROSTATIC DISCHARGE PROTECTION CIRCUIT AND METHOD

This application claims priority under 35 U.S.C. § 119 (e)(1) of provisional application No. 60/034,675, filed Jan. 10, 1997.

FIELD OF THE INVENTION

This invention generally relates to electronic circuits, and more specifically to circuits and methods for protection from electrostatic discharge.

BACKGROUND OF THE INVENTION

Reliability is a key concern in the design of electronic circuits. One of the most common sources of problems is the damage to a circuit or device from electrostatic discharge (ESD). A measure of ESD performance is the ability of a circuit or device to withstand a relatively short exposure to high voltage or current without lasting damage. ESD can be caused by the human body, by poorly grounded machinery such as test equipment, or in noisy environments such as in automotive applications or in consumer applications like computers.

In testing circuits and devices for ESD performance, the circuit or device is typically placed in a tester so that each of the terminals or pins of the device may be stressed relative to the other pins. The pin under test can be stressed with a positive voltage or a negative voltage relative to the other pins. The three main ESD test models are the human body model, the machine model, and the charged device model. The models differ in the voltage and current stress applied, as well as in the duration of the applied stress. For example, the human body model relies on a high voltage (as high as 4000 Volts), high current pulse relatively long in duration, while the machine model provides a short duration, high voltage pulse similar to that which would occur if a terminal or pin of the device touched a grounded conductor.

Figure 1:
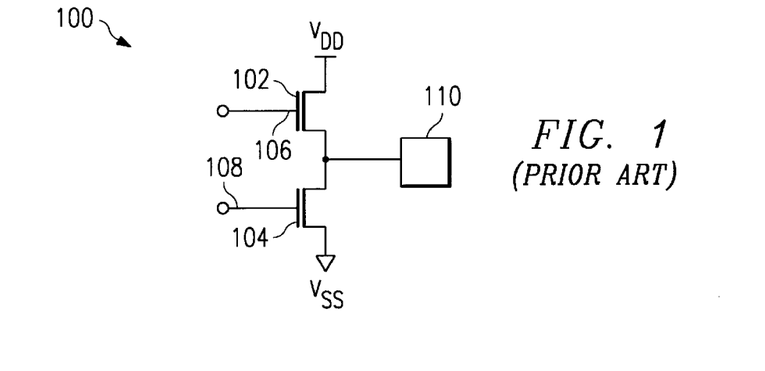
FIG. 1 is a schematic diagram of a prior art output buffer driver.

Pins or terminals of circuits that are driven by output buffer drivers, such as are used on the output pins of memory circuits for example, are particularly susceptible to damage from ESD stress. An example of an output buffer driver 100 is shown in FIG. 1 and comprises a pull-up n-channel metal-oxide-semiconductor field effect transistor (MOSFET) 102 and a pull-down n-channel transistor 104. True and complementary data are presented at nodes 106 and 108. Data is taken out of the circuit at the DQ terminal pad 110. An ESD protection circuit provides a discharge shunting path for the ESD current. In the circuit of FIG. 1, the output driver transistors provide the shunting path, not by operating as MOS transistors, but by operating as bipolar transistors. Field effect transistors comprise doped source and drain regions that form parasitic bipolar transistors with the substrate on which the transistor is fabricated. These parasitic bipolar devices can be used advantageously in an ESD event to dissipate the current into the substrate and across the source and drain of the transistors.

The use of the parasitic bipolar transistors inherent in the circuit of FIG. 1 as the ESD discharge path has been shown to be unreliable when stressed negatively with respect to VDD. Specifically, when VDD is held at 0 Volts and the output pad or pin 110 is stressed negatively to a voltage in the human body model range of 2000 to 4000 Volts, the output buffer shows signs of permanent damage manifested by current leakage when the pad 110 is driven to ground potential. In addition, standby current leakage also occurs because of silicon melt filaments forming across the gate to source/drain regions of the transistors 102 and 104. Testing has shown that these problems are probably the result of the pull-up and pull-down transistors activating during the ESD event. In other words, the transistors operate in the MOS mode instead of in the parasitic bipolar mode. The high voltages and currents generated in an ESD event cannot be properly dissipated by the transistors in the MOS mode, so that permanent damage to the output buffer transistors results. Aspects of the invention are intended to address these problems.

SUMMARY OF THE INVENTION

In accordance with a preferred embodiment of the invention, there is disclosed an integrated circuit. The integrated circuit includes a voltage supply internal to the integrated circuit and circuitry for sensing the voltage level of the internal voltage supply, the circuitry responsive to produce a flag signal that is in a first logical state when the voltage level is below the desired level and in a second logical state when the voltage level is above the desired level. The integrated circuit also includes a buffer driver having an input terminal and an output terminal, the input terminal being coupled to the circuitry for sensing the voltage level of the internal voltage supply. The operation of the circuit is such that the output terminal of the buffer driver is in a high-impedance state when the flag signal is in the first logical state, and is responsive to data signals on the input terminal to produce corresponding output signals at the output terminal when the flag signal is in the second logical state.

An advantage of the embodiment circuit is that the output buffer is prevented from turning on during an ESD event or at other times when the internal voltage supply of the circuit may be at an indeterminate state below a desired operating level. The embodiment circuit causes energy from the ESD event to be dissipated through means other than the activation of the MOS mode of the output buffer, thereby preventing permanent damage to the buffer and to the integrated circuit. The embodiment circuit has been shown to improve ESD performance of the output circuits of a dynamic random access memory integrated circuit from 1.5 kV to 4.0 kV.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 2:
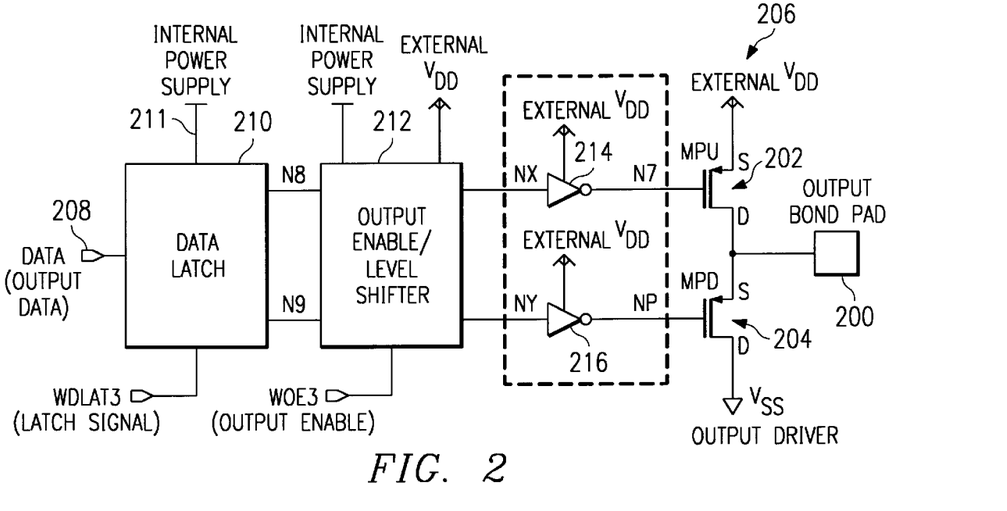
FIG. 2 is a generalized schematic diagram of an output circuit of a dynamic random access memory.

FIG. 2 is a generalized schematic diagram of circuitry for a single output bond pad 200, such as can be used in a dynamic random access memory circuit, for example. The circuit comprises a pull-up MOS transistor 202 and a pull-down MOS transistor 204. Transistors 202 and 204 form a buffer driver 206 as described hereinabove. The inputs to the buffer driver 206 originate at terminal 208, which in a memory circuit is typically a global input/output line connected to a memory cell array. Data latch 210 produces true and complementary versions of the data at terminal 208 on nodes N8 and N9. Data latch 210 uses an internal power supply on power supply terminal 211 and WDLAT3 (data latch signal) to produce the true and complementary data at nodes N8 and N9. The voltage provided by the internal power supply is a lower level, more stable voltage than VDD. The internal power supply is derived from VDD by voltage regulators, but could alternatively be supplied by charge pumps. The internal supply voltage is nominally 3.3 Volts. Output enable/level shifter block 212 receives inputs from nodes N8 and N9 and an output enable signal WOE3, all of which are based on the internal power supply, to produce output signals at nodes NX and NY. The signals at nodes NX and NY are driven to logic voltage levels defined by VDD and VSS. VDD is nominally 5.0 Volts with a tolerance of +/−10%, while VSS is nominally 0 Volts. The voltages at nodes NX and NY are between 0 Volts and 5.0 Volts when the buffer driver is tri-stated. When data is driven to the output pad 200, either node NX or NY is at 5.0 Volts and the remaining node NX or NY is at 0 Volts. Nodes NX and NY are connected to inverters 214 and 216, which in turn supply the inputs to the pull-up 206 and pull-down transistors 208 of the output buffer 206.

As shown in FIG. 2, some of the components, such as the data latch 210 and output enable/level shifter block 212 are supplied with power from an internal power supply, while some of the circuit components are powered by an external VDD supply. The use of voltage regulators and output buffers supplied by multiple power sources is common in the industry. Such an arrangement suffers disadvantages in certain circumstances, however, because the inputs to the output buffer 206 at nodes N7 and NP, which are dependent on the internal power supply, can become undefined or indeterminate. In a short duration ESD event, for example, the internal power supply does not have enough time to stabilize; consequently, the logic circuitry that is dependent upon the internal power supply exists in an undefined state. The indeterminate state of the internal power supply is of concern because if the signals at nodes N8, N9, NX and NY are indeterminate, the signals at nodes N7 or NP could be logic high voltages, thereby activating either the pull-up transistor 202 or the pull-down transistor 204 during an ESD event.

Figure 3A:
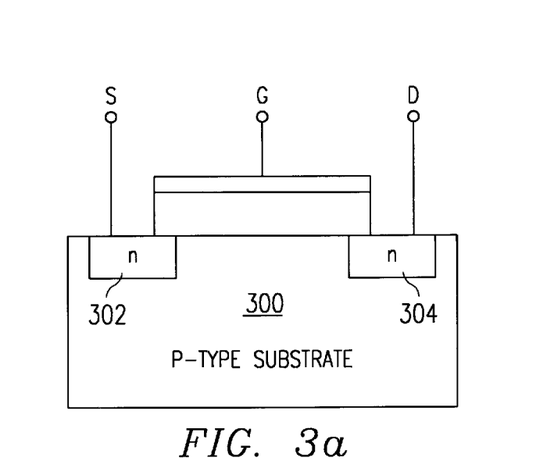
FIG. 3a is cross-sectional diagram of a MOS transistor having a gate potential below the threshold voltage.

Ideally, the output buffer 206 would be tri-stated, or in a high-impedance state, during an ESD event. The output buffer is in a tri-state condition if both the pull-up transistor 202 and pull-down transistor 204 have gate voltages that are less than the threshold voltage, $V_{TN}$, of the transistors between the gate and the source or drain. As long as the output buffer is in its high-impedance state, the pull-up and pull-down n-channel transistors 204 and 206 perform during an ESD event as npn bipolar transistors because of the n-type source and drain regions and the p-type substrate. FIG. 3a shows a cross-section of a MOS transistor in the state where the gate bias is less than the threshold required to induce a channel in the p-type substrate 300 between the source and drain regions 302 and 304. The parasitic npn bipolar transistor is formed by the substrate 300 and the source and drain regions 302 and 304.

As the DQ pad 200 (in FIG. 2) goes to a negative voltage as a result of a negative ESD pulse, the drain-to-substrate junction of the pull-up transistor 202 becomes forward biased. Once the potential between the source and drain of transistor 202 reaches the breakdown voltage of the substrate between those regions, avalanche breakdown occurs and produces a high current path from source to drain and into the substrate. Thus, the parasitic bipolar transistor serves to dissipate ESD current between the DQ pad 200 and the VDD voltage supply pin that is connected to the source of the pull-up transistor 202. The current is dissipated over a relatively large amount of semiconductor so that the heat generated from the event is not localized and does not cause permanent damage to the transistor. It should be noted that during the ESD event, VDD is at 0 Volts.

Figure 3B:
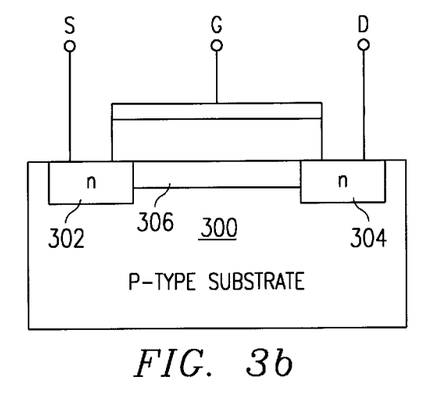
FIG. 3b is a cross-sectional diagram of a MOS transistor having a channel induced by a gate potential above the threshold voltage.

If, on the other hand, during the ESD event, one of the transistors 202 or 204 activates or turns-on, a high current density occurs at the surface of the channel of the transistor, thereby causing local heating of the gate and gate oxide of the transistor. The localized heating near the gate forms small silicon melt filaments between the gate and the source that become leakage paths for current during normal device operation. Filaments can also be formed from source-to-drain or between the source and substrate. FIG. 3b shows a transistor in the "on" state where the gate voltage exceeds the threshold required to induce a channel 306 in the p-type substrate 300 between the source and drain regions 302 and 304.

Figure 4:
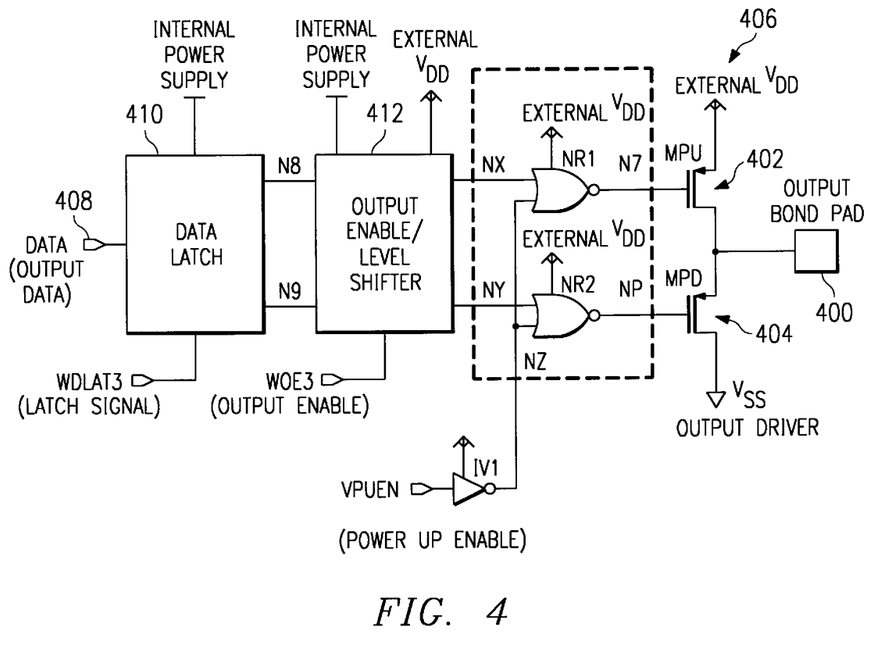
FIG. 4 is a generalized schematic diagram in accordance with an embodiment of the invention.

In an embodiment of the invention, shown in FIG. 4, the circuit of FIG. 2 is modified to ensure that the pull-up and pull-down transistors 402 and 404 of output buffer 406 remain inactive or "off" during an ESD event. Keeping these transistors inactive ensures that the energy from the ESD event at the DQ pad 400 is dissipated in the parasitic bipolar mode of the transistors 402 and 404, rather than in the MOS mode in which there is danger of permanent damage from the high current. Experiments on the circuit of FIG. 2 have shown that when the internal voltage supply is kept at the same level as the VDD external supply, the signals at node N7 and NP remain at a low logic level throughout an ESD event, thus keeping the transistors 202 and 204 "off" (i.e. not operating in MOS mode). In contrast, if the internal voltage supply is allowed to depend on voltage regulators as it would during actual operation, the internal voltage supply was unable to function quickly enough during the ESD event to ensure that the signals at nodes N7 and NP were low logic levels. The signals were instead indeterminate, meaning that they could be at any logic state, including above the threshold voltage required to activate the pull-up and pull-down transistors 202 and 204.

The embodiment circuit of FIG. 4 presents a solution to the problem described above. Logic circuitry is incorporated in the circuit that relies on the external VDD supply to force the output driver 406 into its tri-state condition, thus ensuring that neither the pull-up or pull-down transistors 402 and 404 can be turned on as MOS devices to dissipate current during an ESD event. The circuit also includes a power-up circuit that determines if the circuit has been powered up correctly. This power-up circuit can be used during an ESD event as a flag to determine if the ESD event is occurring, and then to disable the output buffer to ensure that the buffer remains inactive throughout the entire ESD event.

In FIG. 4 the power-up enable signal (VPUEN) is a logic high voltage level only if the proper internal operating voltage levels have been achieved, such as in the absence of an ESD event and when the circuit has been powered-up correctly. VPUEN is generated using the VDD and VSS supplies rather than an internal supply, as may be seen in the circuit of FIG. 7. This ensures that VPUEN remains at a logic low voltage level throughout the ESD event. The same cannot be said if VPUEN was based on the internal voltage supply, which is indeterminate during an ESD event. During an ESD event, VPUEN is driven by VSS, which is the logic low voltage level and is a negative voltage. Also during the ESD event, VDD remains at 0 Volts so that the logic low voltage signal is able to propagate through the logic circuit to ensure that the output buffer 406 remains in its high-impedance state. The inverter IV1 and NOR gates NR1 and NR2 are also based on the externally supplied VDD and VSS. Thus, all of the logic circuitry essential to determining the input of the output buffer 406 relies on an external supply and is therefore not susceptible to the indeterminacy of the internal supply during an ESD event.

If the circuit has encountered an ESD event, or is not otherwise powered up correctly, then VPUEN is a logic low, thereby causing node NZ to be a logic high, which forces node N7 and node NP to a logic low level. If, on the other hand, no ESD event is currently underway and the circuit is powered up correctly, VPUEN goes to a logic high and the WOE3 and DATA signals control how the output buffer 406 is enabled to produce output data that corresponds to the DATA signal.

Figure 5:
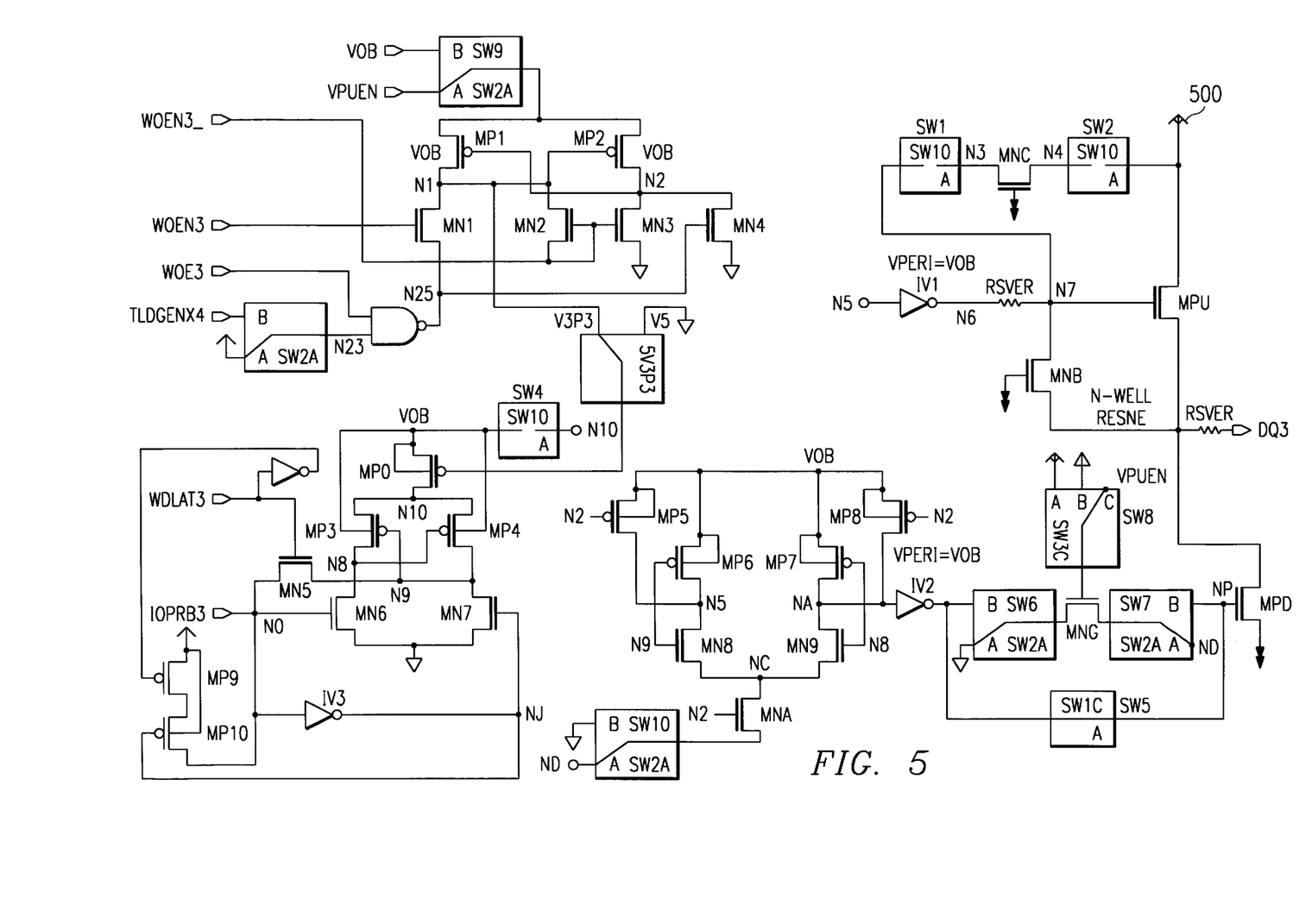
FIG. 5 is a detailed schematic diagram of a circuit implementing the circuit of FIG. 4.

FIG. 5 is detailed schematic of the circuit represented in FIG. 4. Data latch 410 is formed by transistors MP3, MP4, MN6, MN7, MN5, MP9, MP10, and IV3. The level shifter 412 is formed by transistors MP1, MP2, MN1, MN2, MN3, MN4, MP5, MP8, MP6, MP7, MN8, MN9, MNA, and MNG. The output driver 406 is formed by pull-up transistor MPU and pull-down transistor MPD. The output or DQ pad is DQ3. It should be noted that FIG. 4 is a logical representation of the circuit of FIG. 5. Hence, nodes NX and NY do not appear in FIG. 5, nor are NOR gates NR1 and NR2 easily indicated as a block of circuitry in FIG. 5.

During an ESD event or when the circuit has not been properly powered up, VPUEN is at a logic low voltage level. The VPUEN signal is generated by circuits shown in FIGS. 6 and 7, which are described hereinbelow. The circuit shown in FIG. 5 is configured to allow the ESD protection circuitry to be included or excluded by changing a metal layer mask. The ESD protection circuit is selected by connecting switches SW6, SW7, SW9, and SW10 to the "a" settings as shown and by connecting the switch SW8 to the "c" setting. The VPUEN signal is selected at switch SW9. The VOB signal is the same as the external VDD signal referred to hereinabove. Selection of VOB at switch SW9 along with the selections described above would bypass the ESD protection circuitry. Selection of VPUEN at switch SW9 connects VPUEN to the source of transistors MP1 and MP2. It should be noted that the implanted tanks or wells of the p-channel transistors MP1 and MP2 are tied to VOB regardless of the selection made at switch SW9.

When VPUEN is at a logic low voltage (which is true during power-up and during an ESD event), node N2 goes to a logic low level. Node N2 is the output of the level shifter and is primarily responsible for enabling or disabling the output buffers. VPUEN also connects to the gate of transistor MNG and ensures that node NC is not discharged. This inhibits node N5 and node NA from being pulled to a logic low level. A logic low level at node N2 forces node N5 and node NA to be a logic high level. Node N5 is connected to the input of inverter IV1 and node NA is connected to the input of inverter IV2. These two inverters generate the signal at node N7 and node NP and forces these nodes to a logic low level when the signal VPUEN is a logic low level.

The WOEN3_, WOEN3, and WOE3 signals determine when the output buffer is to be enabled during normal operation of the circuit. IOPRB3 is the data line from the memory cell array, for example. During the normal operation of the output circuit, VPUEN is a logic high level that enables the level shifter so that when WOEN3_ is a logic low, WOEN3 is a logic high, and WOE3 is a logic high, the output buffer is enabled. The output buffer drives out high or low logic levels corresponding to the data held in the data latch that had appeared previously on IOPRB3. Once node N2 goes to a logic high, node N9 and node N8 determine whether node N5 or node NA are driven to a logic low. If node N5 or node NA are driven to a logic low, then either node N7 or node NP goes to a logic high level.

Figure 6:
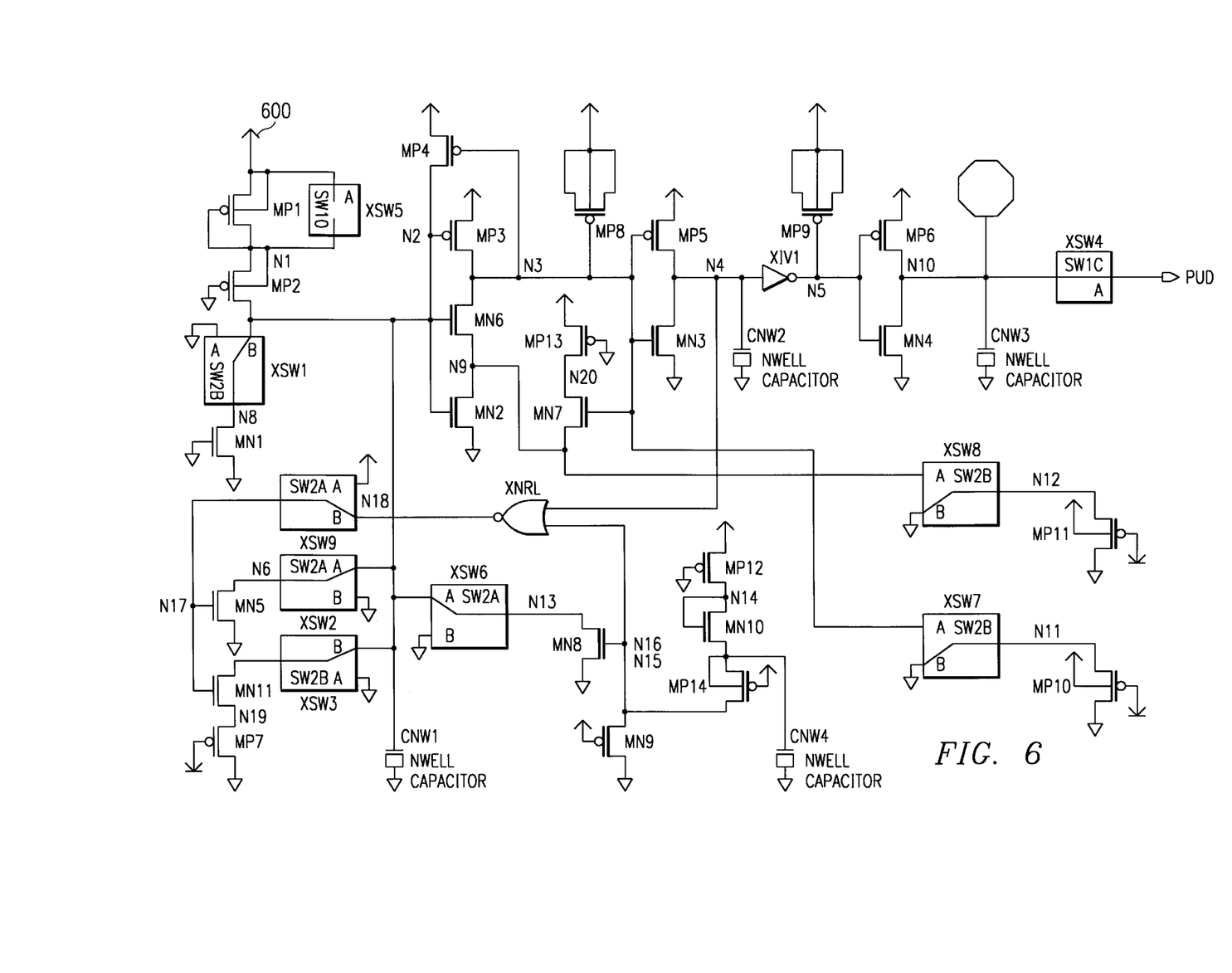
FIG. 6 is a detailed schematic diagram of a circuit for detecting when the internal voltage supply reaches the desired operating level.

The circuit of FIG. 6 is used to generate the VPUEN signal. Specifically, the circuit is designed to detect when the internally supplied voltage reaches approximately half (1.2 Volts to 1.4 Volts) of its operating level of 3.3 Volts, whether the voltage is the result of a power-up operation or the result of an ESD event. The internally supplied voltage level at which this detection occurs during normal circuit operation is approximately the threshold voltage of a transistor above the external VSS supply voltage. During an ESD event, of course, VSS follows the voltage on the DQ pad to a negative value (in an ESD event causing a negative discharge voltage), and is therefore no longer a valid basis of comparison to describe the threshold at which the internal voltage is detected.

As discussed above, in an ESD event and in the early stages of the power-up procedure, it is desirable that the output buffer remain in its high-impedance state. The VPUEN signal is instrumental in the output buffer achieving that state and is derived from the power-up detect (PUD) signal shown at the output of the circuit of FIG. 6. It should be noted that the symbol indicated by element 600 in FIG. 6 is used to denote an internal supply voltage. This is in contrast to the symbol indicated by elements 500 and 700 in FIGS. 5 and 7 that indicate an external VDD voltage supply. The general function of the circuit of FIG. 6 is to ensure that the PUD signal is a logic low until the internal supply voltage reaches a level sufficient to indicate normal operation of the circuit. The internal supply voltage typically must reach approximately 1.2 to 1.4 Volts for the PUD signal to change from a logic low level to a logic high level. Capacitors CNW1 and CNW2 serve to hold PUD low until the internal supply voltage reaches the desired level. Thus, in the period prior to full power up and during an ESD event when the internal voltage supply level is indeterminate, the PUD signal is kept low. Only when the internal voltage supply at a sufficient level will PUD change to a high level.

Figure 7:
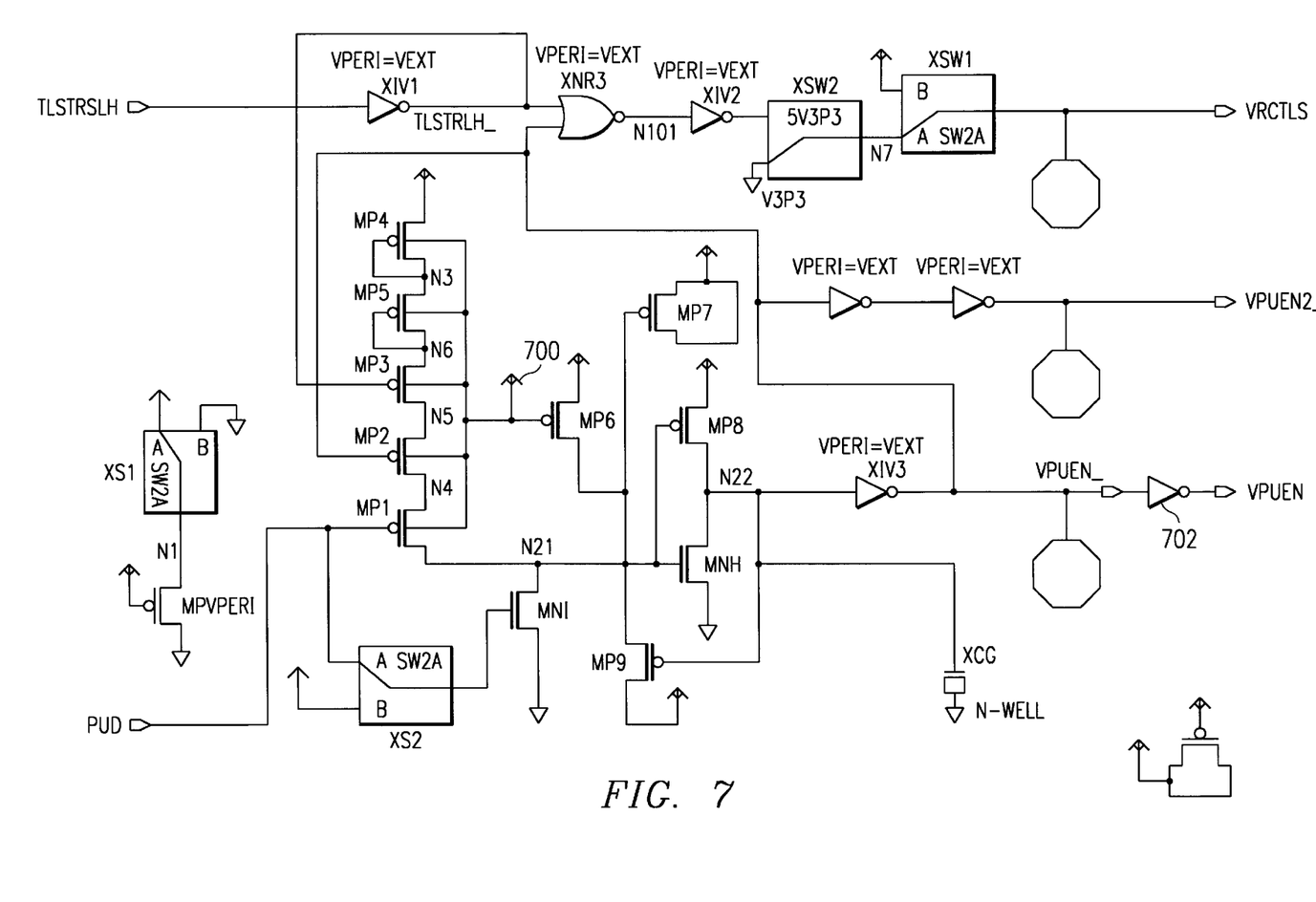
FIG. 7 is a detailed schematic diagram of a circuit for generating the VPUEN signal shown in FIG. 5.

The PUD signal is used as an input to the circuit of FIG. 7, which is responsible for generating the VPUEN signal. In general, as long as PUD is a logic low, the transistor MNI is inactive or "off" so that node N21 is a logic high level. If node N21 is logic high, node N22 is low (the transistor pair MP8 and MNH is an inverter), and the output of inverter XIV3 (VPUEN_) is high, so that VPUEN at the output of inverter 702 is low. As stated above, if VPUEN is a logic low, the output buffer remains in the high-impedance state. On the other hand, in normal operation, when the internal supply voltage reaches the threshold described above, transistor MNI is active or "on" and VPUEN is a logic high level. The state of the output buffer is then determined by WOEN3_, WOEN3, and WOE3 as described above with reference to the circuit of FIG. 5. Note that the circuit of FIG. 7 relies on the external VDD supply as denoted by the symbol indicated by element 700. Using the external VDD supply to control the generating of VPUEN in the circuit of FIG. 7 ensures that VPUEN is not subject to the indeterminacy in the internal supply voltage during an ESD event or during power up.

One skilled in the art will appreciate that the circuit described in FIG. 5 serves a single DQ output pad. Each output pad of a memory integrated circuit, for example, would be protected by a similar circuit. One advantage of the embodiment circuit in addition to its role in ESD protection is that it can reduce contention on the system bus during power-up if more than one memory device is sharing the bus by keeping the output pins in a high-impedance state when not in use. Another advantage to the circuit shown in FIG. 5 is that the switches used to select the ESD protection circuit, i.e. SW6, SW7, SW8, SW9, and SW10 were added with changes to only five mask levels, thus making the circuit easy to incorporate in existing designs. An important advantage of the embodiment circuit is that it improves the human body model ESD performance of the memory circuit on which it was tested from 1.5 kV to 4.0 kV.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit, comprising:
   a voltage supply internal to said integrated circuit;
   circuitry for sensing the voltage level of said internal voltage supply, said circuitry responsive to produce a flag signal, said flag signal being in a first logical state when said voltage level is below said desired level and in a second logical state when said voltage level is above said desired level; and
   a buffer driver having an input terminal and an output terminal, said input terminal coupled to said circuitry for sensing the voltage level of said internal voltage supply;
   wherein said output terminal of said buffer driver is in a high-impedance state when said flag signal is in said first logical state, and is responsive to data signals on said input terminal to produce corresponding output signals at said output terminal when said flag signal is in said second logical state.

2. The integrated circuit of claim 1, wherein said buffer driver comprises pull-up and pull-down MOS transistors, said pull-up transistor having a terminal coupled to a supply voltage generated externally to said integrated circuit.

3. The integrated circuit of claim 1, further including circuitry for processing said flag signal connected between said circuitry for sensing the voltage level of said internal voltage supply and said input terminal of said buffer driver, said circuitry for processing said flag signal being coupled to a supply voltage generated externally to said integrated circuit.

4. The integrated circuit of claim 1, wherein said output terminal of said buffer driver is an output pad of a dynamic random access memory circuit.

5. A circuit for protecting against electrostatic discharge, comprising:

a terminal for receiving a voltage supplied externally to said integrated circuit;
a voltage supply internal to said integrated circuit;
circuitry for sensing the voltage level of said internal voltage supply, said circuitry responsive to produce a flag signal, said flag signal being in a first logical state when said voltage level is below said desired level and in a second logical state when said voltage level is above said desired level;
a buffer driver comprising pull-up and pull-down transistors, each of said transistors having an input terminal and said transistors sharing an output terminal, said pull-up transistor having a power terminal coupled to said terminal for receiving a voltage supplied externally, said input terminals connected to said circuitry for sensing the voltage level of said internal voltage supply;
said transistors being in an inactive state when said flag signal is in said first logical state such that said shared output terminal is in a high-impedance state, and said transistors being active when said flag signal is in said second logical state such that said buffer driver is responsive to data signals on said input terminals of said transistors to produce corresponding output signals at said shared output terminal.

6. The integrated circuit of claim 5, further including circuitry for processing said flag signal connected between said circuitry for sensing the voltage level of said internal voltage supply and said input terminals of said transistors, said circuitry for processing said flag signal being coupled to a supply voltage generated externally to said integrated circuit.

7. The integrated circuit of claim 5, wherein said shared output terminal is coupled to an output pad of a dynamic random access memory circuit.

8. A method of operating an integrated circuit, comprising the steps of:
   receiving an external voltage at an internal voltage supply;
   generating an internal voltage from the internal voltage supply;
   sensing a level of the internal voltage;
   producing a control signal in response to the step of sensing;
   enabling an output circuit in response to a first logic state of the control signal; and
   disabling the output circuit in response to a second logic state of the control signal.

9. A method as in claim 8, further comprising the steps of:
   applying a datum to an input terminal of the output circuit;
   producing the datum at an output terminal of the output circuit in response to the first logic state; and
   producing a high impedance state at the output terminal of the output circuit in response to the second logic state.

10. A method as in claim 9, further comprising the steps of:
    turning on a first output transistor and turning off a second output transistor of the output circuit in response to the first logic state and a first datum state;
    turning on the second output transistor and turning off the first output transistor of the output circuit in response to the first logic state and a second datum state;
    turning off the first and second output transistors of the output circuit in response to the second logic state.

11. A method as in claim 10, further comprising the steps of:

turning on the first output transistor by applying the external voltage to a control gate of the first transistor; and turning on the second output transistor by applying the external voltage to a control gate of the second transistor.

12. A method as in claim 8, wherein the step of generating an internal voltage further comprises the steps of:

generating a first internal voltage intermediate the external voltage and a reference voltage; and generating a second internal voltage less than the first internal voltage.

13. A method as in claim 12, wherein the second internal voltage is less than the reference voltage.

14. A method as in claim 12, wherein the step of sensing the level of the internal voltage comprises sensing the level of each of the first and second internal voltages.

15. A method as in claim 8, further comprising the steps of:

latching a datum in a data latch;

applying the latched datum to a level shifting circuit;

shifting a magnitude of the datum from a magnitude of the internal voltage to a magnitude of the external voltage;

applying the datum having a magnitude of the external voltage to a first input terminal of a control circuit;

applying the control signal to a second input terminal of the control circuit;

producing the datum at an output terminal of the control circuit in response to the first logic state; and producing the datum at an output terminal of the output circuit in response to the datum at the output terminal of the control circuit.

16. A method as in claim 15, wherein the control circuit comprises plural NOR gates.

* * * * *